US007602258B2

(12) United States Patent
Jordy et al.

(10) Patent No.: US 7,602,258 B2
(45) Date of Patent: Oct. 13, 2009

(54) CIRCUITS, SYSTEMS, AND METHODS FOR A VOLTAGE CONTROLLED OSCILLATOR WITH COARSE, FINE, AND CENTER TUNING

(75) Inventors: George Jordy, Hopewell Junction, NY (US); Gregory Blum, Lagrangeville, NY (US)

(73) Assignee: Seiko Epson Corporation, Tokyo (JP)

( * ) Notice: Subject to any disclaimer, the term of this patent is extended or adjusted under 35 U.S.C. 154(b) by 118 days.

(21) Appl. No.: 11/831,700

(22) Filed: Jul. 31, 2007

(65) Prior Publication Data

US 2009/0033433 A1 Feb. 5, 2009

(51) Int. Cl.
*H03K 3/287* (2006.01)
*H03K 3/288* (2006.01)

(52) U.S. Cl. .......................... 331/143; 331/16; 331/111

(58) Field of Classification Search ................. 331/111, 331/113 R, 143, 144, 16
See application file for complete search history.

(56) References Cited

U.S. PATENT DOCUMENTS 4,146,849 A 3/1979 Satou
4,270,102 A 5/1981 Gawler et al.
5,859,571 A 1/1999 Lee et al.
6,137,372 A 10/2000 Welland
7,053,724 B2 * 5/2006 Rusu et al. .................. 331/143
2006/0003720 A1 1/2006 Lee et al.
2006/0238261 A1 10/2006 Rhee et al.

* cited by examiner

*Primary Examiner*—Robert Pascal
*Assistant Examiner*—James E Goodley

(57) ABSTRACT

Circuits, systems, and methods for generating a variable oscillator output. The circuits generally comprise a capacitor configured to receive first and second currents of a first polarity (e.g., charging currents) and a third current of a second polarity opposite to the first polarity (e.g., a discharge current). The circuit further comprises a first circuit configured to receive a bias input, a second circuit configured to receive a coarse control input, and a third circuit configured to receive a fine control input. The first circuit is further configured to provide the first current in response to the bias input. The second circuit is further configured to provide the second current in response to the coarse control input, such that the second current generally has a magnitude of from zero to a multiple of the magnitude of the first current. The third circuit is further configured to provide the third current when the capacitor has a voltage that passes a threshold voltage determined by the fine control input. The present invention advantageously provides for producing a variable oscillator output over a broad range with the coarse control input, while also having low gain with the fine control input. The present invention is also advantageously suitable for standard integrated circuit manufacturing processes because the bias input can be adjusted to compensate for process variations.

24 Claims, 8 Drawing Sheets

360
304
Vdd
381
Vdd
390
330
339
338
393
392
320
387
391
321
Vdd
302
Coarse
380
386
337
341
340
336
343
342
Vdd
385
335
331
383
382
334
384
371
333
370
Vdd
373
372
332
Bias
305
Ref
303
Bias
301

CIRCUITS, SYSTEMS, AND METHODS FOR A VOLTAGE CONTROLLED OSCILLATOR WITH COARSE, FINE, AND CENTER TUNING

FIELD OF THE INVENTION

The present invention generally relates to the field of voltage frequency oscillators. More specifically, embodiments of the present invention pertain to circuits and systems for variable frequency oscillators with coarse, fine, and center tuning, and methods of using the same.

DISCUSSION OF THE BACKGROUND

A variable frequency oscillator (VFO) generally produces an oscillating signal with a frequency that may be controlled by an external control. The control signal may generally comprise a variable voltage (for a voltage controlled oscillator [VCO]), a variable current, or a numeric digital value (for a digital or numerically controlled oscillator [NCO]). VFOs generally have characteristic gain curves such as those shown in FIG. 1A. This gain curve relates the frequency of oscillation to the input control amplitude.

FIG. 1A shows gain curves for a hypothetical oscillator over three different manufacturing process runs. For CMOS processes, manufacturing variations occur in a wide variety of parameters. From the viewpoint of circuit operation, some of the most important are transistor threshold, transconductance, and parasitic capacitance. The three curves of FIG. 1A represent gain curves for the same oscillator design over fast, typical, and slow process variations. A slow process corner (e.g., a process resulting in a VFO with gain curve 101) may have high threshold transistors of low transconductance ($g_m$) and high parasitic capacitance. Gain curve 102 represents a nominal center of the manufacturing process. A fast process corner (e.g., a process resulting in a VFO with gain curve 103) may have transistors of low threshold, high gain, and low parasitic capacitance.

FIG. 1A shows that an oscillator may have unacceptable frequency output characteristics under some process variations. Frequency 110 represents the target frequency for a hypothetical application of an oscillator. FIG. 1A shows that an oscillator with slow gain curve 101 cannot attain nominal center frequency 110, because no point on slow gain curve 101 intersects the target frequency. Thus, for this hypothetical application, chips manufactured at a slow process corner generally cannot be used.

FIG. 1B shows a more desirable set of gain curves for a hypothetical oscillator which is usable under all manufacturing process variations. In such a hypothetical oscillator, nominal center frequency 110' may be similar for all 3 curves, such that only the slope (gain) changes. Generally when such an oscillator is used in a phase locked loop, the lowest jitter and highest stability may be obtained with the minimum gain slope for the application. Therefore, it is desirable to produce a variable frequency oscillator which can compensate for process variations in such a manner. In order to reduce manufacturing costs, it is even more desirable to produce such a variable frequency oscillator using standard integrated circuit processes.

The problem of process variation particularly applies to oscillators consisting only of components manufactured according to standard integrated circuit processes. VFOs which include tuned resonators (e.g., inductors, crystals, SAW resonators, etc.) generally do not vary as much in frequency over process variations. However, these non-standard or "off-chip" resonators may significantly increase manufacturing costs. Therefore, it is even more desirable to produce a variable frequency oscillator which can compensate for process variations using standard integrated circuit processes, so that substantially all of the VFO can be produced on-chip.

It can be seen that circuits and methods for compensating the gain and center frequency of a variable oscillator (and particularly a ring oscillator) for process variations is desirable. In addition, a digital circuit is preferable to analog circuitry for modem CMOS processes where digital logic tends to occupy less die area than analog functions. Furthermore, a reduction in slope of the gain curve (e.g., reduced variation in frequency for equal variation in control signal) is desirable when the variable oscillator is used in phase locked loop applications. The compensation circuits and methods should allow such a reduction in slope while preserving the usability of the variable oscillator for a wide range of process variations.

SUMMARY OF THE INVENTION

Embodiments of the present invention relate to circuits, systems, and methods for generating a variable oscillator output. The circuit generally comprises a capacitor configured to receive first and second currents of a first polarity and a third current of a second polarity opposite to the first polarity. The circuit further comprises a first circuit configured to receive a bias input, a second circuit configured to receive a coarse control input, and a third circuit configured to receive a fine control input. The first circuit (e.g., a bias circuit) is further configured to provide the first current in response to the bias input. The second circuit (e.g., a coarse control circuit) is further configured to provide the second current in response to the coarse control input, such that the second current generally has a magnitude of from zero to a multiple of the magnitude of the first current. The third circuit (e.g., a fine control circuit) is further configured to provide the third current when the capacitor has a voltage that passes a threshold voltage determined by the fine control input. In a preferred embodiment, the first polarity (e.g., the polarity of the charging currents) is negative and the second polarity (e.g., the polarity of the discharging current) is positive.

In another embodiment the fine control circuit comprises a threshold voltage generator configured to generate the threshold voltage in response to the fine control input, a comparison circuit configured to compare the voltage of the capacitor to the threshold voltage and to produce a comparison output, and a discharge circuit configured to provide the third current in response to the comparison output. In a further embodiment, the circuit includes an output circuit configured to produce an oscillator output in response to the comparison output.

In one exemplary embodiment, the comparison circuit comprises a differential amplifier. For example, the differential amplifier may include first and second FET transistors, wherein the gate of the first FET transistor is coupled to the threshold voltage, the gate of the second FET transistor is coupled to the capacitor, and the source nodes of the first and second FET transistors are coupled to the bias input or a derivative thereof (e.g., an amplified bias current). The threshold voltage generator may be configured to generate the threshold voltage in response to a difference between the fine control input and an input reference voltage (e.g. with another differential amplifier.

In one exemplary embodiment, the coarse control circuit comprises yet another differential amplifier configured to produce the second current in response to a difference between the coarse control input and an input reference voltage. For example, this differential amplifier may include first and second FET transistors wherein the gate of the first FET transistor is coupled to the input reference voltage, the gate node of the second FET transistor is coupled to the coarse control input, and the source nodes of the first and second FET transistors are coupled to the bias input or a derivative thereof. The drain node of the second FET transistor may be coupled to the capacitor to produce the second current.

In another embodiment, the circuit includes the reference voltage input and a reference voltage adjustment circuit configured to adjust the reference voltage to compensate for variations in process, voltage, and/or temperature.

The systems generally comprise those that include circuits or implement methods embodying one or more of the inventive concepts disclosed herein. For example, an integrated circuit device according to the present invention may include the variable oscillator circuit described above. The integrated circuit device may also include a current source configured to produce the bias input. In a preferred embodiment, the current source is configured to adjust the bias input to compensate for variations in process, voltage, and/or temperature.

The method of producing a periodic signal according to the present invention includes the steps of generating the periodic signal by injecting a first current to a capacitor and, when a charge on the capacitor is greater than a threshold value, discharging the capacitor, coarsely adjusting the periodic signal by injecting a second current with a magnitude of from zero to a multiple of the magnitude of the first current to the capacitor, and finely adjusting the periodic signal by adjusting the threshold value. In one exemplary embodiment, the first and second currents may have a negative polarity, while the capacitor may be discharged by applying a third current with a positive charge.

The step of finely adjusting the periodic signal may include determining the threshold value in response to a fine control input. In another embodiment, the method may include comparing the charge on the capacitor to the threshold value to produce a comparison output and discharging the capacitor in response to the comparison output. In a further embodiment, the method may include producing an oscillator output in response to the comparison output.

In one exemplary embodiment, the comparing step includes generating a threshold voltage in accordance with the threshold value, applying the threshold voltage to a gate node of a first FET transistor in a differential amplifier circuit, applying the voltage of the capacitor to a gate node of a second FET transistor in the differential amplifier circuit, and applying a bias input or a derivative thereof to source nodes of the first and second FET transistors. Generating the threshold voltage may include comparing the fine control input to an input reference voltage.

In another embodiment, the method includes generating the second current by comparing a coarse control input to an input reference voltage. For example, coarsely adjusting the periodic signal may include applying an input reference voltage to a gate node of a first FET transistor in a differential amplifier, applying a coarse control input to a gate node of a second FET transistor in the differential amplifier, and applying a bias input or a derivative thereof to source nodes of the first and second FET transistors. In a further embodiment, the step of coarsely adjusting the periodic signal further comprises applying a drain node of said second FET to said capacitor.

In a preferred embodiment, the method includes generating the first current in accordance with a bias input. The method may also include adjusting the bias input to compensate for process variations. The center frequency of the periodic signal may generally be adjusted by adjusting the first current (e.g., by adjusting the bias input).

The present invention advantageously provides for producing a variable oscillator output over a broad range with the coarse control input, while also having low gain with the fine control input. The present invention is also advantageously suitable for standard integrated circuit manufacturing processes because the bias input can be adjusted to compensate for process, temperature, and/or voltage (PVT) variations.

These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications, and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Furthermore, for the sake of convenience and simplicity, the terms “clock,” “time,” “rate,” “period” and “frequency” are generally used interchangeably herein, but are generally given their art-recognized meanings. Also, for convenience and simplicity, the terms “connected to,” “coupled with,” “coupled to,” and “in communication with” (which terms also refer to direct and/or indirect relationships between the connected, coupled and/or communication elements unless the context of the term’s use unambiguously indicates otherwise) may be used interchangeably, but these terms are also generally given their art-recognized meanings.

The invention, in its various aspects, will be explained in greater detail below with regard to exemplary embodiments.

An Exemplary Circuit

Figure 1A:
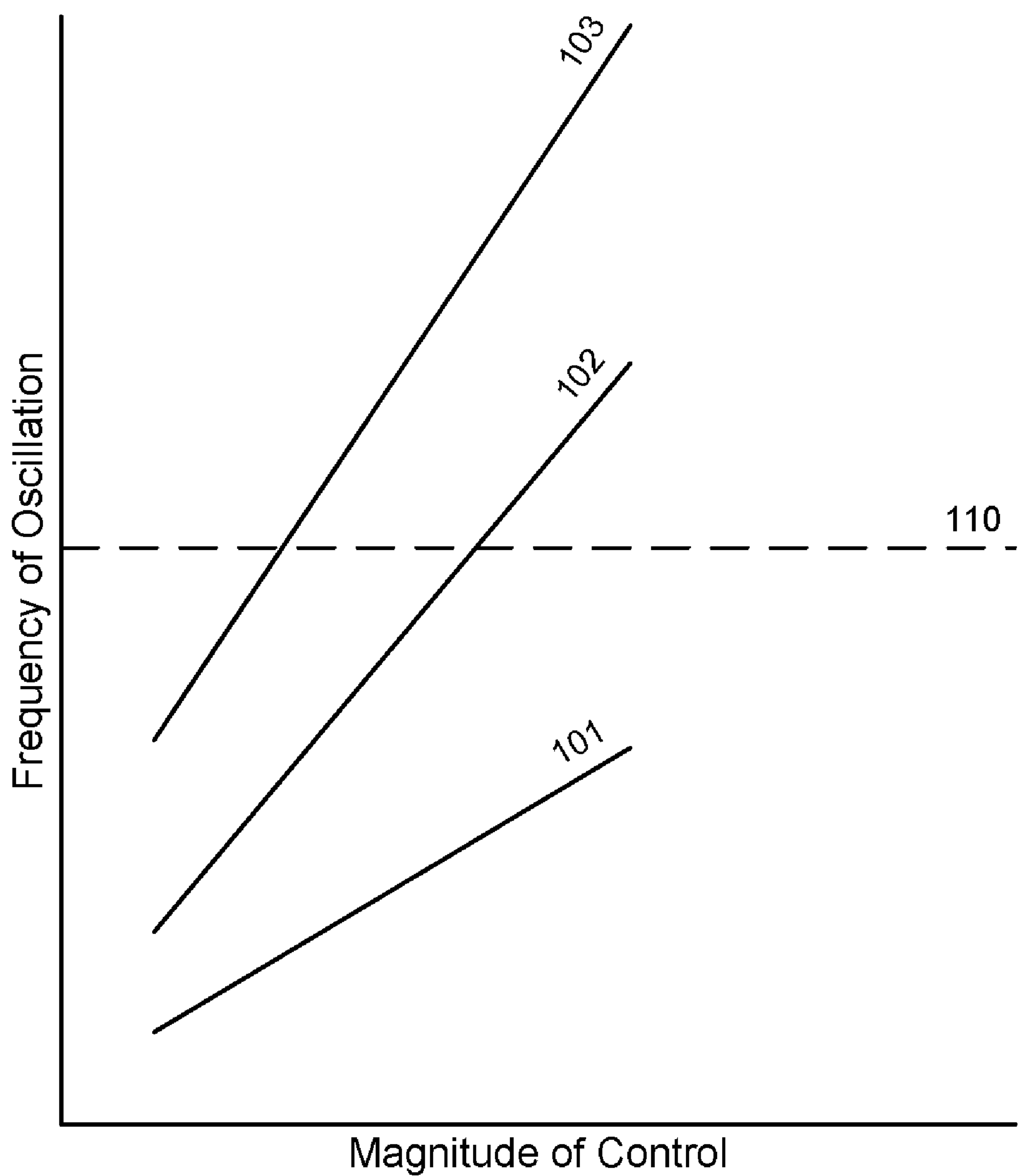
FIG. 1A is a graph showing gain curves for a hypothetical variable oscillator over process variations.
Figure 1B:
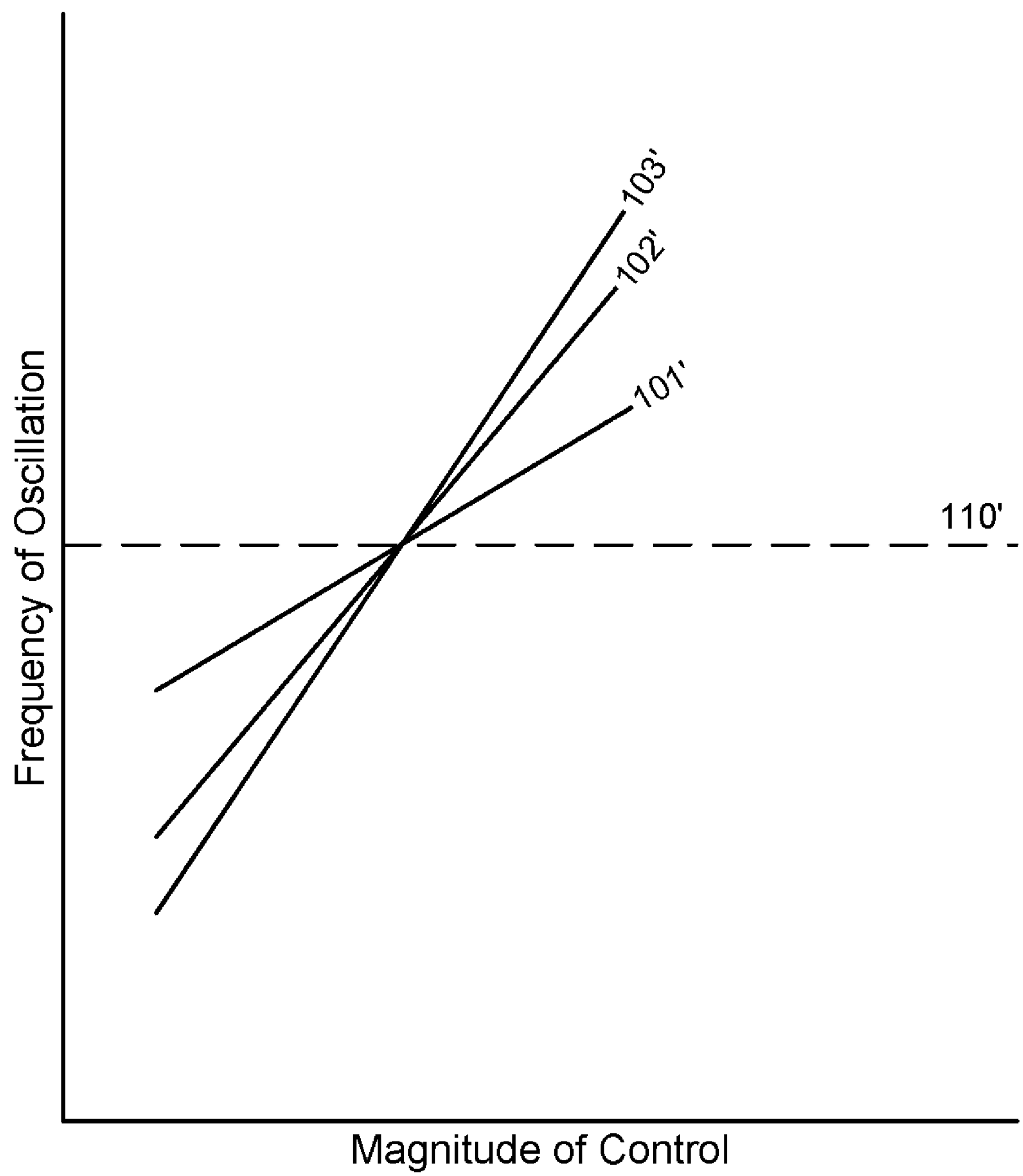
FIG. 1B is a graph showing desired gain curves for a hypothetical variable oscillator over process variations.
Figure 2A:
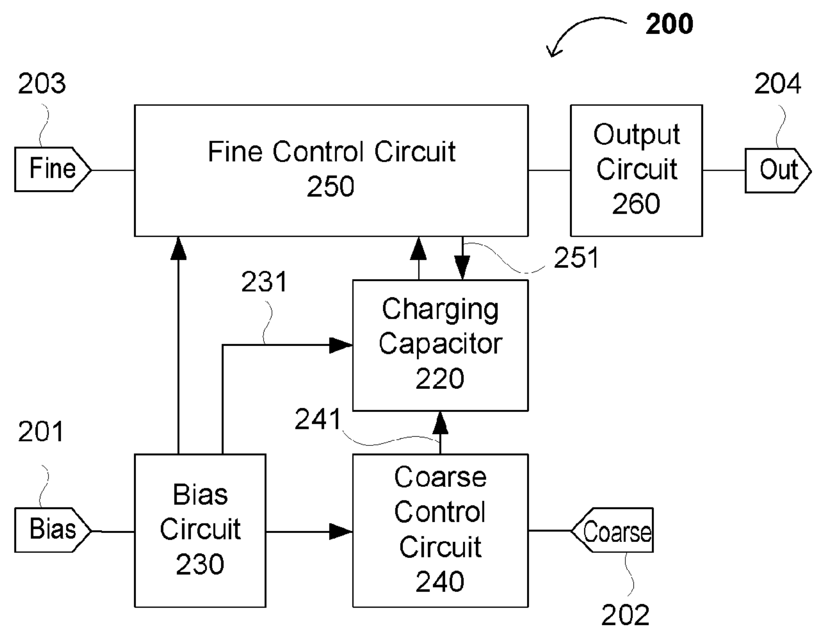
FIG. 2A is a block diagram of an exemplary variable frequency oscillator (VFO) according to the present invention.

Referring now to FIG. 2A, a block diagram of variable frequency oscillator (VFO) 200 for generating a variable oscillator output 204 is shown. VFO 200 includes a charging capacitor 220 configured to receive first current 231 and second current 241. Current 231 and Current 241 have a first polarity (e.g., current 231 and current 241 may have a negative charge). Charging capacitor 220 is also configured to receive a third current 251, where current 251 has a second polarity opposite to the first polarity (e.g., current 251 may have a positive charge). VFO 200 also includes bias circuit 230, coarse control circuit 240, and fine control circuit 250. Bias circuit 230 is configured to receive bias input 201 (e.g., a bias current) and to produce current 231 in response to bias input 201.

Coarse control circuit 240 is configured to receive coarse control input 202 and to produce current 241 in response to coarse control input 202, such that the current 241 generally has a magnitude of from zero to a multiple of the magnitude of current 231. Fine control circuit 250 is configured to receive fine control input 203 and to provide the current 251 (e.g., a discharge current) when the capacitor 220 has a voltage that passes a threshold voltage determined by fine control input 203. In a preferred embodiment, the first polarity (e.g., the polarity of currents 231 and 241) is negative and the second polarity (e.g., the polarity of the discharging current 251) is positive.

The magnitudes of bias current 231 and coarse control current 241 generally determine the rate at which charging capacitor 220 is charged. Fine control circuit 250 determines the voltage at which charging capacitor 220 is discharged. Thus, the combination of bias current 231 (derived from bias input 201), coarse control current 241 (derived from bias input 201 and controlled by coarse control input 202) and the threshold voltage of fine control circuit 250 (controlled by fine control input 203) generally determines the oscillating frequency of VFO 200. In one exemplary embodiment, output circuit 260 produces output signal 204 in response to an output of fine control circuit 250.

Figure 2B:
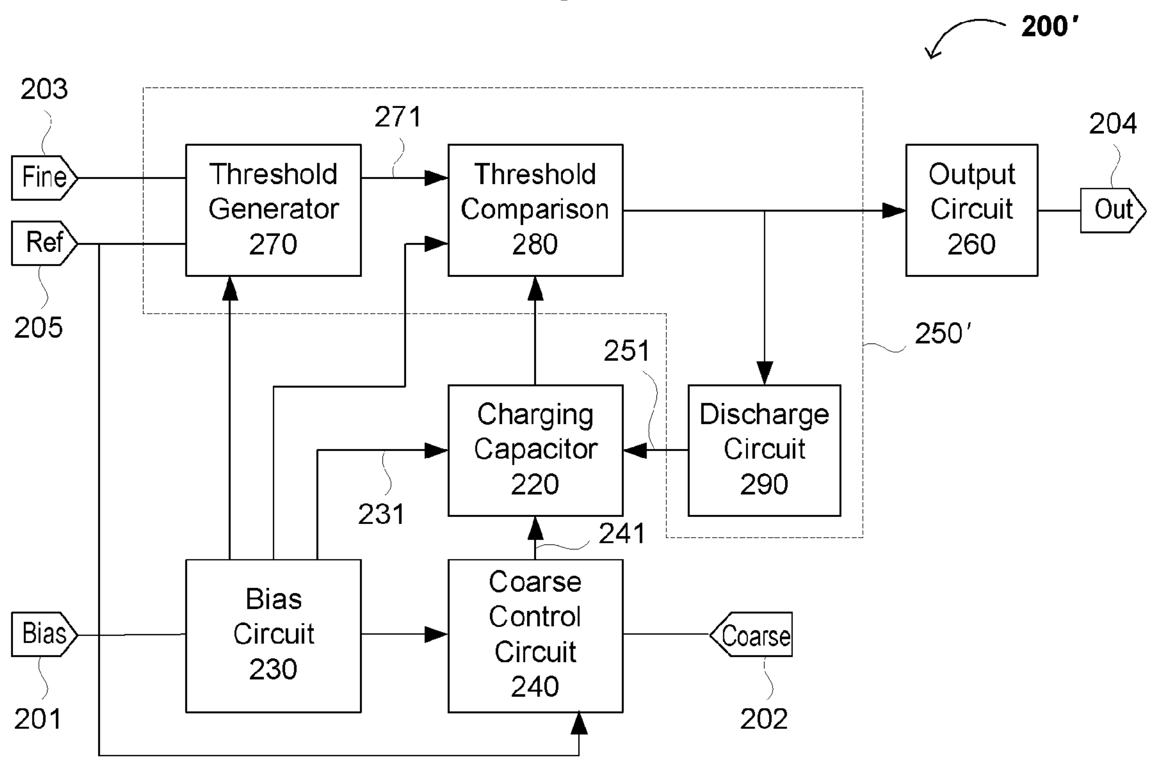
FIG. 2B is a block diagram of another exemplary VFO according to the present invention.

Referring now to FIG. 2B, fine control circuit 250' includes threshold generator 270, threshold comparison circuit 280, and discharge circuit 290. Threshold generator 270 is configured to generate threshold voltage 271 in response to fine control input 203. Threshold generator 270 may be configured to generate threshold voltage 271 in response to a difference between fine control input 203 and input reference voltage 205. Threshold comparison circuit 280 is configured to compare the voltage of the capacitor 220 to threshold voltage 271 and to produce comparison output 281. Discharge circuit 290 is configured to provide current 251 (e.g., the discharge current) in response to comparison output 281. Output circuit 260 is configured to produce oscillator output 204 in response to the comparison output.

Figure 3:
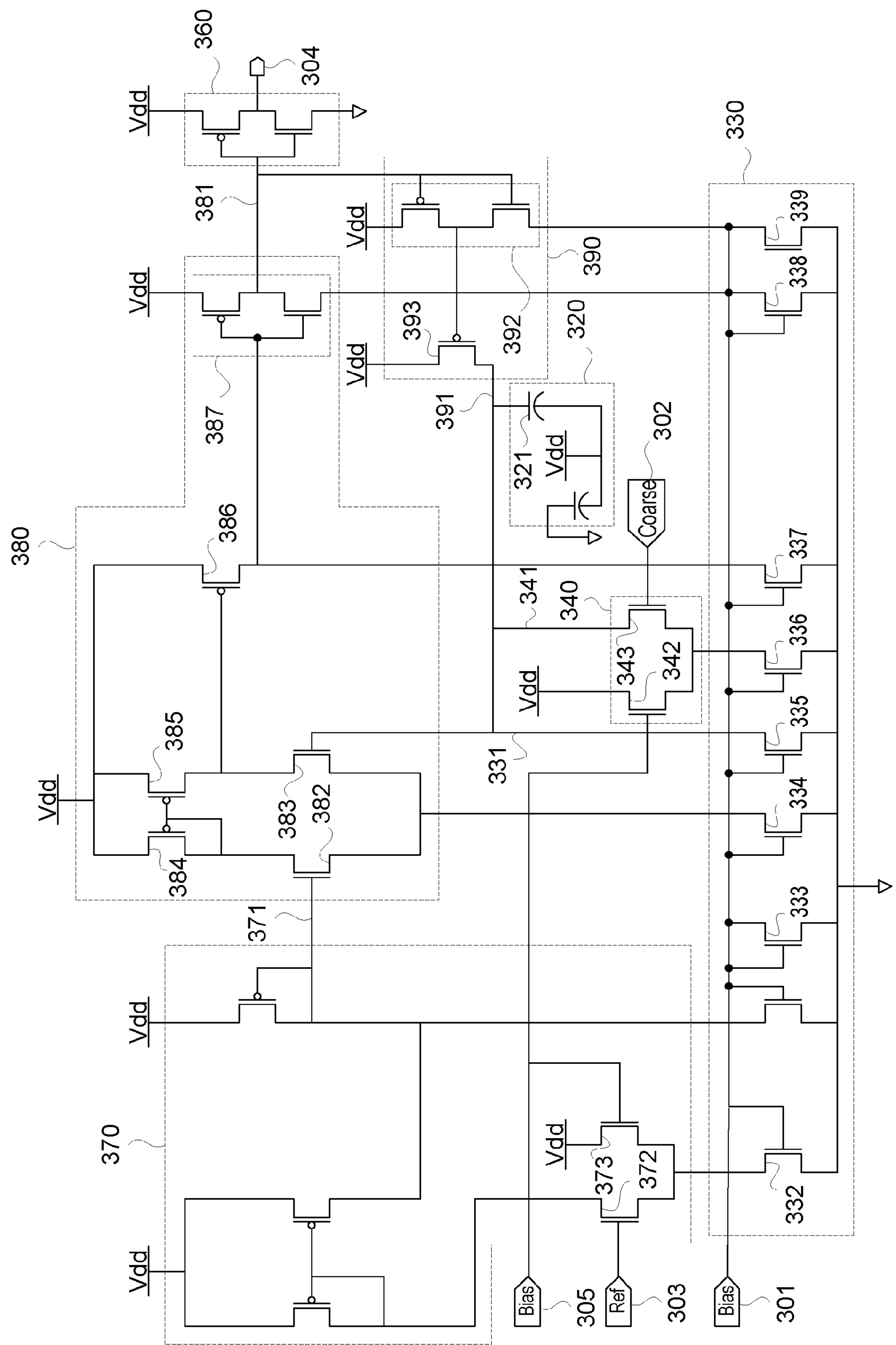
FIG. 3 is a circuit diagram of an exemplary VFO according to the present invention.

Referring now to FIG. 3, a circuit diagram of a VFO 300 according to the present invention is shown. Transistors 332 to 339 in bias circuit 330 (generally corresponding to bias circuit 230 of FIGS. 2A and 2B) generally provide bias currents proportional to the current of bias input 301. Thus, process variations can be compensated for by adjusting the current of bias input 301, thereby adjusting the bias currents provided to the various circuit blocks in VFO 300. In addition, bias circuit 330 provides charging current 331 derived from bias input 301 by transistor 335 to capacitor 321.

Coarse control circuit 340 (generally corresponding to coarse control circuit 240 of FIGS. 2A and 2B) includes another differential amplifier, configured to provide coarse control current 341 to capacitor 321 in response to a difference between coarse control input 302 and input reference voltage 305. This differential amplifier comprises first FET transistor 341 and second FET transistor 342. In this case, transistors 341 and 342 are n-type FET transistors. The gate of the transistor 341 is coupled to input reference voltage 305. The gate of the transistor 342 is coupled to coarse control input 302. The source nodes of both transistors 341 and 342 are coupled to a bias current derived from bias input 301 by transistor 336. The drain node of the transistor 342 provides coarse control charging current 341 to capacitor 321. Thus, the magnitudes of bias charging current 331 and coarse control charging current 341 generally determine the rate at which capacitor 321 is charged. As a result, changes to the voltage of coarse control input 302 can vary the frequency of the oscillator output over a relatively wide range of values.

Threshold generator 370 (generally corresponding to threshold generator 270 of FIG. 2B) generates the threshold voltage 371 in response to a difference between fine control input 303 and input reference voltage 305. Thus, threshold generator 370 includes a differential amplifier comprising first FET transistor 372 and second FET transistor 373. In this case, transistors 372 and 373 are n-type FET transistors. The gate of transistor 372 is coupled to fine control input 303. The gate of the transistor 373 is coupled to input reference voltage 305. The source nodes of both transistors 372 and 373 are coupled to a bias current derived from bias input 301 by transistor 332. Threshold generator 370 advantageously maps the fine control input 303 to an appropriate threshold voltage 371 for comparison to the voltage at capacitor 321. Threshold generator 370 thereby provides for a low gain control of the output frequency by adjusting fine control input 303.

Comparison circuit 380 (generally corresponding to comparison circuit 280 of FIG. 2B) includes a differential amplifier comprising first FET transistor 382 and second FET transistor 383. In this case, transistors 382 and 383 are n-type FET transistors. The gate of the transistor 382 is coupled to the threshold voltage 371. The gate of the transistor 383 is coupled to capacitor 321. The source nodes of both transistors 382 and 383 are coupled to a bias current derived from bias input 301 by transistor 334. Transistors 384 and 385 generally operate as current sources to speed up the switching characteristics of transistors 382 and 383. Thus, when the voltage of capacitor 321 reaches the threshold voltage 371, transistor 383 may be quickly turned off and the drain of transistor 385 pulled high. As a result, transistor 386 (e.g., a p-type FET transistor) is turned off, and inverter 387 produces a positive comparison output signal 381.

Discharge circuit 390 (generally corresponding to discharge circuit 290 of FIG. 2B) provides a discharge current 391 in response to comparison output 381. In this embodiment, comparison output 381 is coupled to the input of inverter 392. When the comparison output 381 is high (e.g., when the voltage of capacitor 321 is above the threshold voltage 371), the gate of transistor 393 (e.g., a p-type FET transistor) will be pulled low, thereby providing discharge current 351 (e.g., a current with a positive charge) to capacitor 321. In this embodiment, output circuit 360 (generally corresponding to output circuit 260 of FIGS. 2A and 2B) comprises an inverter configured to produce an inverted copy of comparison signal 381 as output signal 304.

A VFO according to the present invention is very flexible because it has a coarse and fine gain control as well as center frequency control. The VFO can be tuned over a large range with the coarse control while also having low gain with the fine control. In addition, the bias input can be adjusted to compensate for process variations. Thus, VFOs according to the present invention are suitable for manufacturing using a standard integrated circuit process because it does not need any precision components to achieve its performance.

Thus, in one exemplary embodiment the invention relates to an integrated circuit device including one or more of the VFO circuits described above. The integrated circuit device may also include a current source configured to produce the bias input. In a preferred embodiment, the current source is configured to adjust the bias input to compensate for process variations.

An Exemplary Method

Figure 4:
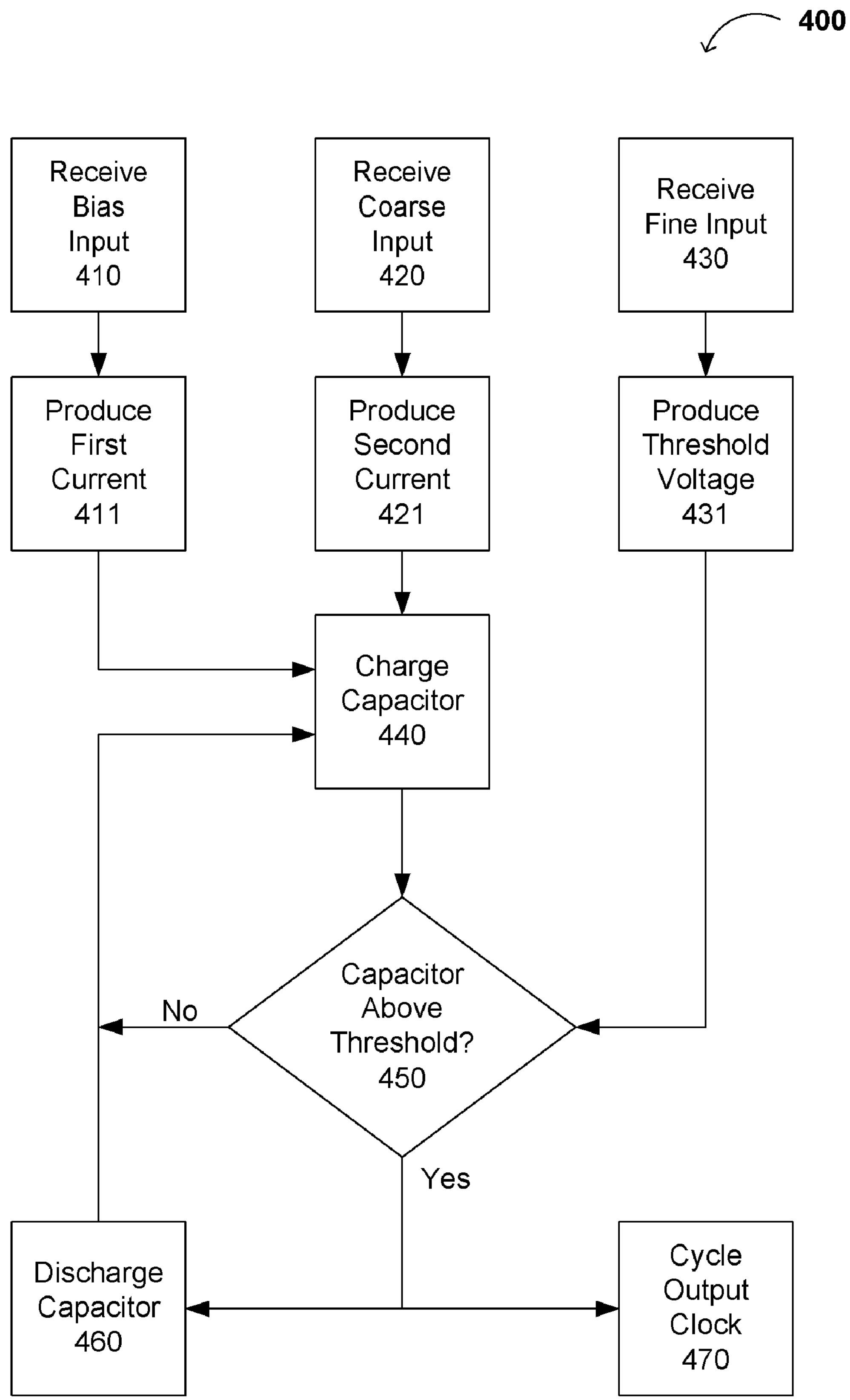
FIG. 4 is a flow chart of an exemplary method according to the present invention.

Referring now to FIG. 4, a flow chart 400 of an exemplary method of producing a variable oscillator output according to the present invention is shown. Step 410 includes receiving a bias input and step 411 includes producing a first current having a first polarity in response thereto. At the same time, step 420 includes receiving a coarse control input and step 421 includes producing a second current having the first polarity (e.g., a second negative charging current) in response thereto. At step 440, the first and second currents are applied to a charging capacitor, thereby increasing the voltage across the capacitor over time. The second current generally has a magnitude of from zero to a multiple of the magnitude of the first current.

Also substantially simultaneously with steps 410-421, step 430 includes receiving a fine control input and step 431 includes producing a threshold voltage in response to fine control input. Step 450 includes comparing the voltage of the charging capacitor to the threshold voltage produced at step 431. While the voltage of the capacitor is below the threshold voltage, the capacitor continues to receive the first and second charging currents at step 440. When the voltage of the capacitor is above the threshold voltage, step 450 includes producing a third current having a second polarity opposite of the first polarity (e.g., a positive discharge current), and applying the discharge current to the capacitor at step 440. Also when the voltage of the capacitor is above the threshold voltage, step 470 may include cycling an output clock (e.g., pulling the output clock low when the capacitor is discharged, then pulling it high again while the capacitor recharges).

Step 431 of producing the threshold voltage may further comprise comparing the fine control input to an input reference voltage (e.g., using a differential amplifier). Step 450 of comparing the voltage of the capacitor the threshold voltage may include steps of applying the threshold voltage to a gate node of a first FET transistor in a differential amplifier circuit, applying the voltage of the capacitor to a gate node of a second FET transistor in the differential amplifier circuit, and applying the bias input or a derivative thereof to source nodes of the first and second FET transistors.

Step 421 of producing the second current may include comparing the coarse control input to an input reference voltage. For example, the method may include producing the second current by applying an input reference voltage to a gate node of a first FET transistor in yet another differential amplifier, applying the coarse control input to a gate node of a second FET transistor in the differential amplifier, and applying the bias input or a derivative thereof to source nodes of the first and second FET transistors. Thus, producing the second current may further comprise applying a drain node of the second FET to the capacitor.

The method may also include a step of producing the bias input for step 410. Producing the bias input may comprise adjusting the bias input to compensate for process variations. The method may also include steps of adjusting a center frequency of the variable oscillator output by adjusting the bias input, coarsely adjusting a frequency of the oscillator output by adjusting the coarse control input, and/or finely adjusting a frequency of the oscillator output by adjusting the fine control input.

This method advantageously provides for producing a variable oscillator output over a broad range with the coarse control input, while also having low gain with the fine control input. The present invention is also advantageously suitable for standard integrated circuit manufacturing processes because the bias input can be adjusted to compensate for process variations.

Figure 5A:
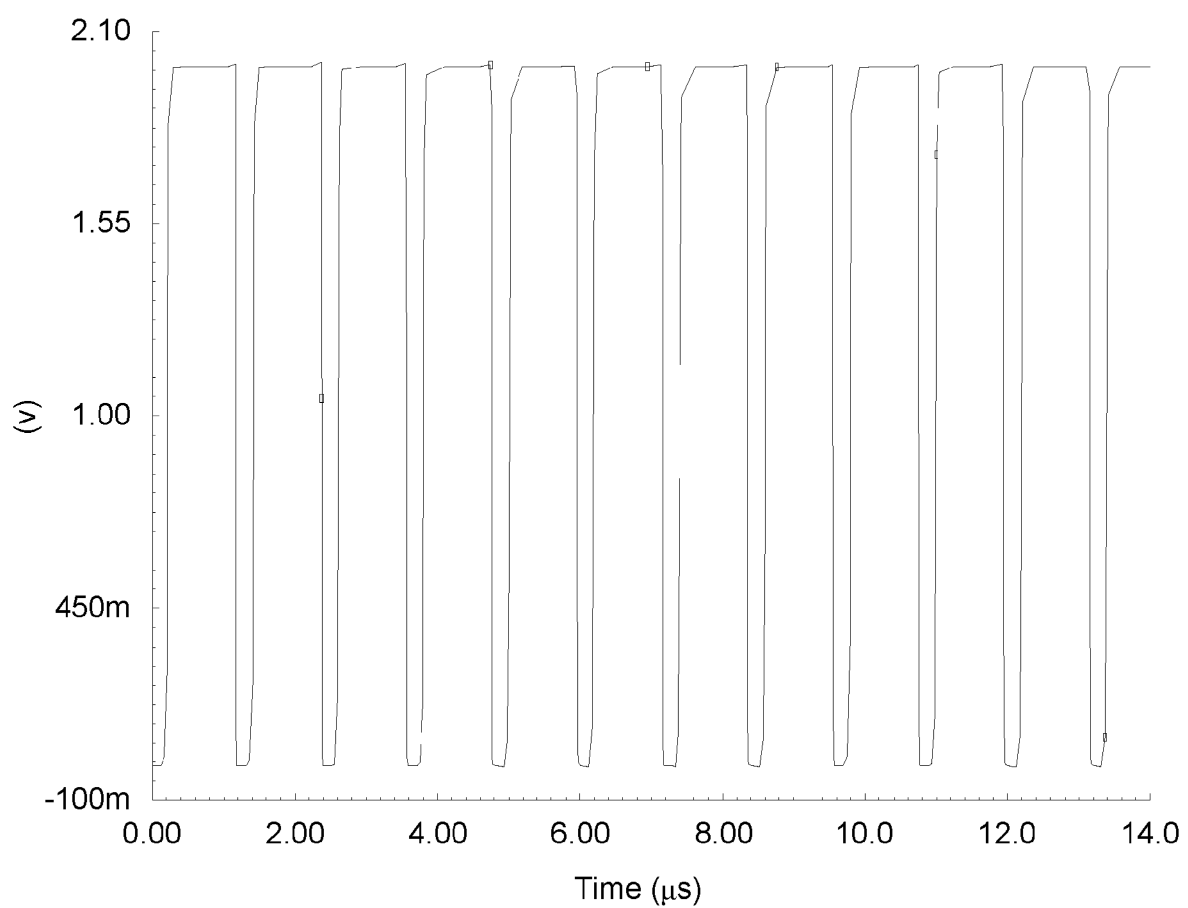
FIG. 5A is a graph of an output signal of a circuit according to the present invention.

Referring now to FIG. 5A, an exemplary pulsed output of a VFO according to the present invention is shown. For example, FIG. 5A may represent output 304 of FIG. 3 and/or the result of step 470 in FIG. 4. Generally, a threshold comparison (e.g., at threshold comparison circuit 380 or comparison step 450) can produce a comparison output in response to comparison of the charge across a charging capacitor to a threshold value (e.g., a threshold voltage). The comparison output signal can drive both an output signal and discharge current. While the capacitor is charging (e.g., before the comparison circuit and/or step determines that the charge on the capacitor has exceeded a threshold voltage), the comparison output may be in a first comparison state (e.g., either "high" or "low") corresponding to a first output state (for example, corresponding to the "high" state of the signal shown in FIG. 5A. When the charge on the capacitor reaches the threshold value, the comparison signal may be switched to a second (complementary) state. This change in state may both discharge the capacitor and change the state of the output signal to a corresponding second output state (e.g., corresponding to the "low" state of the output signal shown in FIG. 5A). After the capacitor is discharged, the cycle repeats.

The frequency of oscillation of the output signal is determined by both the rate at which the capacitor is charged, and by the threshold value at which the capacitor is discharged. The rate at which the capacitor is charged in a VFO according to the present invention is generally determined by the magnitudes of the first and second currents applied to the capacitor. The first current is generally produced as a derivative of an input bias current, which may be adjusted to compensate for process variations. The second current is generally produced in response to a coarse control input voltage.

Figure 5B:
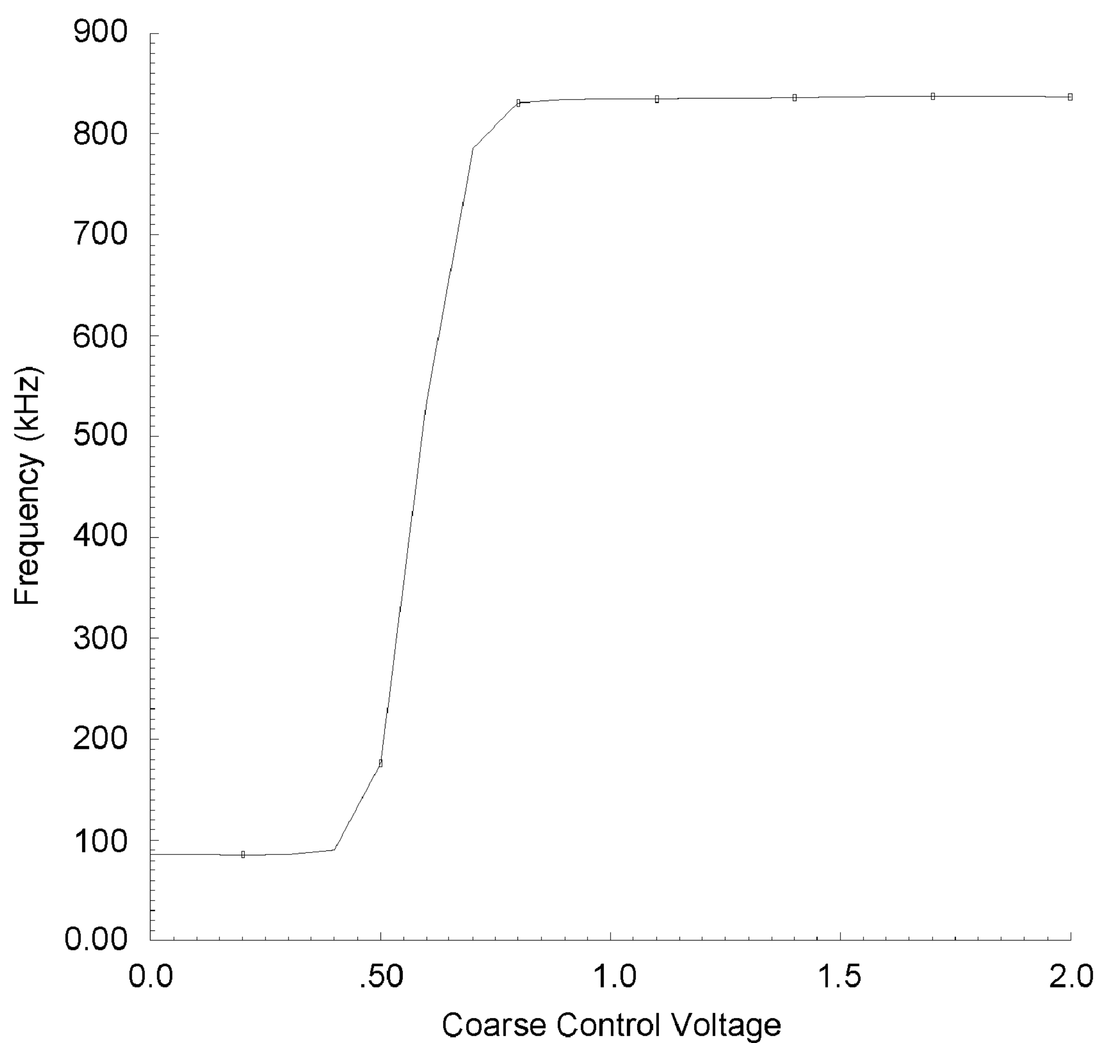
FIG. 5B is a graph of a frequency response to a coarse control signal in a circuit according to the present invention.

Referring now to FIG. 5B, a tuning curve of a VFO according to the present invention for the coarse control voltage is shown. As the coarse control input voltage is increased, the second current applied to the capacitor is generally increased. As a result, the capacitor charges more quickly and reaches the threshold voltage more quickly. FIG. 5B shows an exemplary relationship between the output frequency and the coarse control voltage. There is generally a range of coarse control voltages where the relationship between the coarse control voltage and the output frequency is approximately linear. In this example, the linear range of coarse control is from about 0.50 V to about 0.80 V. Over this coarse control voltage range, the output frequency can vary from about 100 kHz to about 800 kHz.

Figure 5C:
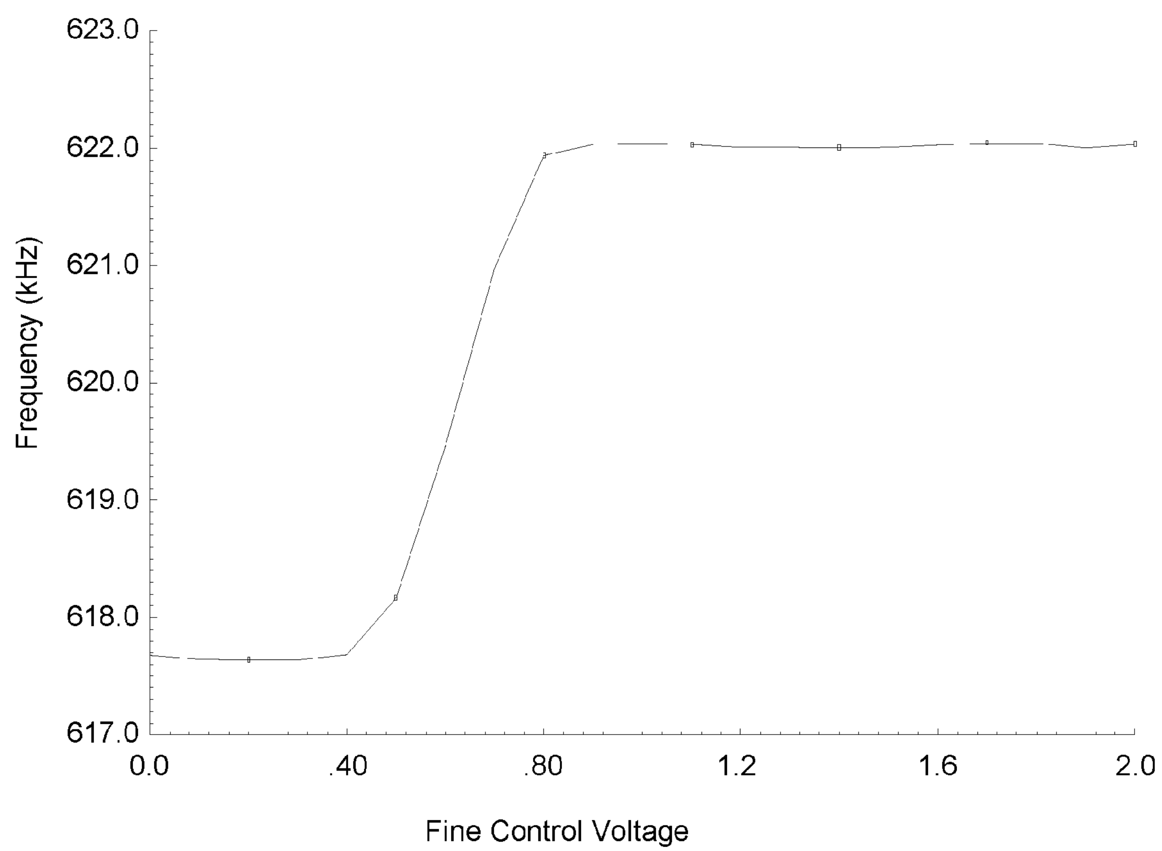
FIG. 5C is a graph of a frequency response to a fine control signal in a circuit according to the present invention.

Referring now to FIG. 5C, a tuning curve of a VFO according to the present invention for the fine control voltage is shown. The fine control voltage generally controls the threshold voltage at which the capacitor is discharged and the output signal is cycled. As the fine control input is increased, the threshold voltage is changed. As a result, the capacitor may take more or less time to reach the threshold voltage, thereby changing the output frequency. As with the coarse control voltage, there is generally a range of fine control voltages where the relationship between the fine control voltage and the output frequency is approximately linear. In this example, the relationship between the fine control input and the output frequency is approximately linear from about 0.5V to about 0.8V. Over this fine control voltage range, the output frequency can vary over a range of approximately 4 kHz. Thus, changes in the coarse control voltage can change the frequency of oscillation more than ten times as much as changes in the fine control voltage.

CONCLUSION/SUMMARY

Thus, the present invention provides circuits, systems, and methods and for generating a variable oscillator output. The present invention advantageously provides for producing a variable oscillator output over a broad range with the coarse control input, while also having low gain with the fine control input. The present invention is also advantageously suitable for standard integrated circuit manufacturing processes because the bias input can be adjusted to compensate for process variations.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. A variable oscillator circuit, comprising:

a capacitor configured to receive first and second currents of a first polarity and a third current of a second polarity opposite to the first polarity;

a first circuit configured to receive a bias input and provide said first current in response thereto;

a second circuit configured to receive a coarse control input and provide said second current in response thereto, wherein said second current has a magnitude of from zero to a multiple of the magnitude of said first current; and a third circuit configured to receive a fine control input and provide said third current when said capacitor has a voltage that passes a threshold voltage determined by said fine control input;

wherein said second circuit comprises a differential amplifier configured to produce said second current in response to a difference between said coarse control input and an input reference voltage.

2. The circuit of claim 1, wherein said first polarity is negative and said second polarity is positive.

3. The circuit of claim 1, wherein said third circuit comprises:

a threshold voltage generator configured to generate said threshold voltage in response to said fine control input;

a comparison circuit configured to compare said voltage of said capacitor to said threshold voltage and to produce a comparison output; and a discharge circuit configured to provide said third current in response to said comparison output.

4. The circuit of claim 3, further comprising an output circuit configured to produce an oscillator output in response to said comparison output.

5. The circuit of claim 3, wherein said comparison circuit comprises a differential amplifier.

6. The circuit of claim 3, wherein said threshold voltage generator is further configured to generate said threshold voltage in response to a difference between said fine control input and an input reference voltage.

7. The circuit of claim 1, wherein said differential amplifier comprises a first FET transistor and a second FET transistor, and wherein:

a gate node of said first FET transistor is coupled to said input reference voltage;

a gate node of said second FET transistor is coupled to said coarse control input; and source nodes of said first and second FET transistors are coupled to said bias input or a derivative thereof.

8. The circuit of claim 7, wherein a drain node of said second FET transistor is coupled to said capacitor and is configured to produce said second current.

9. An integrated circuit device comprising the variable oscillator circuit of claim 1.

10. The circuit of claim 1, further comprising a current source configured to produce said bias input.

11. The integrated circuit device of claim 10, wherein said current source is configured to adjust said bias input to compensate for variations in process, voltage, and/or temperature.

12. A variable oscillator circuit, comprising:

a capacitor configured to receive first and second currents of a first polarity and a third current of a second polarity opposite to the first polarity;

a first circuit configured to receive a bias input and provide said first current in response thereto;

a second circuit configured to receive a coarse control input and provide said second current in response thereto, wherein said second current has a magnitude of from zero to a multiple of the magnitude of said first current; and a third circuit configured to receive a fine control input and provide said third current when said capacitor has a voltage that passes a threshold voltage determined by said fine control input;

wherein said third circuit comprises:

a threshold voltage generator configured to generate said threshold voltage in response to said fine control input;

a comparison circuit configured to compare said voltage of said capacitor to said threshold voltage and to produce a comparison output; and a discharge circuit configured to provide said third current in response to said comparison output;

wherein said comparison circuit comprises a differential amplifier; and wherein said differential amplifier comprises a first FET transistor and a second FET transistor, and wherein:

a gate node of said first FET transistor is coupled to said threshold voltage;

a gate node of said second FET transistor is coupled to said capacitor; and source nodes of said first and second FET transistors are coupled to said bias input or a derivative thereof.

13. A method of producing a periodic signal, said method comprising:

generating said periodic signal by injecting a first current to a capacitor and, when a charge on said capacitor is greater than a threshold value, discharging said capacitor;

coarsely adjusting said periodic signal by injecting a second current with a magnitude of from zero to a multiple of the magnitude of said first current to said capacitor; and finely adjusting said periodic signal by adjusting said threshold value;

wherein said coarsely adjusting further comprises:

applying an input reference voltage to a gate node of a first FET transistor in a differential amplifier;

applying a coarse control input to a gate node of a second FET transistor in said differential amplifier; and applying a bias input or a derivative thereof to source nodes of said first and second FET transistors.

14. The method of claim 13, wherein said first and second currents have a negative polarity.

15. The method of claim 13, wherein said finely adjusting further comprises determining said threshold value in response to a fine control input.

16. The method of claim 15, further comprising comparing said charge on said capacitor to said threshold value to produce a comparison output and discharging said capacitor in response to said comparison output.

17. The method of claim 16, further comprising producing an oscillator output in response to said comparison output.

18. The method of claim 13, further comprising generating said second current by comparing a coarse control input to an input reference voltage.

19. The method of claim 13, wherein said coarsely adjusting further comprises applying a drain node of said second FET to said capacitor.

20. The method of claim 13, further comprising generating said first current in accordance with a bias input.

21. The method of claim 20, further comprising adjusting said bias input to compensate for process variations.

22. The method of claim 13, further comprising adjusting a center frequency of said periodic signal by adjusting said first current.

23. A method of producing a periodic signal, said method comprising:

generating said periodic signal by injecting a first current to a capacitor and, when a charge on said capacitor is greater than a threshold value, discharging said capacitor;

coarsely adjusting said periodic signal by injecting a second current with a magnitude of from zero to a multiple of the magnitude of said first current to said capacitor;

finely adjusting said periodic signal by adjusting said threshold value, and determining said threshold value in response to a fine control input; and comparing said charge on said capacitor to said threshold value to produce a comparison output and discharging said capacitor in response to said comparison output;

wherein said comparing comprises:

generating a threshold voltage in accordance with said threshold value;

applying said threshold voltage to a gate node of a first FET transistor in a differential amplifier circuit;

applying said voltage of said capacitor to a gate node of a second FET transistor in said differential amplifier circuit; and applying a bias input or a derivative thereof to source nodes of said first and second FET transistors.

24. The method of claim 23, wherein generating said threshold voltage comprises comparing said fine control input to an input reference voltage.

* * * * *